(12) United States Patent
Goto et al.

(10) Patent No.: US 7,142,435 B2
(45) Date of Patent: Nov. 28, 2006

(54) LID FOR USE IN PACKAGING AN ELECTRONIC DEVICE AND METHOD OF MANUFACTURING THE LID

(75) Inventors: Masaaki Goto, Kamakura (JP); Fumiaki Nishiuchi, Ayase (JP); Misao Nakajima, Hiratsuka (JP); Mitsuo Zen, Souka (JP); Sanae Taniguchi, Saitama (JP); Takenori Azuma, Koshigaya (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 218 days.

(21) Appl. No.: 10/614,350

(22) Filed: Jul. 8, 2003

(65) Prior Publication Data

US 2004/0094320 A1    May 20, 2004

(30) Foreign Application Priority Data

Jul. 19, 2002    (JP)    ............................. 2002-210365

(51) Int. Cl.
   *H05K 9/00*    (2006.01)
(52) U.S. Cl. ..................................... 361/818
(58) Field of Classification Search ................ 361/816, 361/818, 51, 760, 767, 800, 803; 174/35 GC, 174/51, 52.1, 52.2, 35 R, 52.4
See application file for complete search history.

(56) References Cited

U.S. PATENT DOCUMENTS

| | | | | |
|---|---|---|---|---|
| 5,608,188 A | * | 3/1997 | Choon et al. | ............. 174/35 R |
| 5,838,551 A | * | 11/1998 | Chan | .......................... 361/818 |
| 6,758,387 B1 | * | 7/2004 | Zen | .......................... 228/180.1 |
| 6,867,982 B1 | * | 3/2005 | Ito et al. | ..................... 361/752 |
| 2002/0121072 A1 | * | 9/2002 | Yoshino et al. | ............... 53/404 |

FOREIGN PATENT DOCUMENTS

| | | |
|---|---|---|
| JP | 02244658 | 9/1990 |
| JP | 11191601 | 7/1999 |

* cited by examiner

*Primary Examiner*—Kamand Cuneo
*Assistant Examiner*—Ivan Carpio
(74) *Attorney, Agent, or Firm*—Michael Tobias

(57) ABSTRACT

A lid for use with a plate-shaped base to seal an electronic device such as a SAW device includes a top portion, a wall structure extending from the top portion, and a lip connected to the lower end of the wall structure. The lip extends outwards from an outer surface of the wall structure by 10–500 μm and has solder on an inner surface thereof. The lid can be soldered to a plate-shaped base to form a package. The lid can be conveniently formed by performing drawing of a metal strip coated with solder to define a recessed shape, and then severing a flange of the recessed shape to define the lip.

12 Claims, 6 Drawing Sheets

LID FOR USE IN PACKAGING AN ELECTRONIC DEVICE AND METHOD OF MANUFACTURING THE LID

BACKGROUND OF THE INVENTION

1. Field of the Invention

This invention relates to a lid for use in packaging an electronic device, and in particular to a cap-shaped lid which is suitable for use with a plate-shaped base and which has a solder layer on its inner surface. The present invention also relates to a method of manufacturing such a lid.

2. Description of the Related Art

Minute electronic parts such as SAW (surface acoustic wave) filters are generally in the form of package which comprises a box-shaped ceramic base receiving an electronic device such as a surface acoustic wave device and a plate-shaped lid sealed to the top end surface of the box-shaped base. The lid is typically made of a material such as Kovar (a Co—Ni—Fe alloy) or Alloy 42 (42 Ni—Fe), which has a coefficient of thermal expansion close to that of a ceramic. A solder layer is formed on one side of the lid, and a layer of Au or other material which is easily wet by molten solder is provided on the top end surface of the base which is to be soldered to the lid. After the electronic device is disposed inside the box-shaped base, the lid is placed atop the base with the side of the lid having the solder layer formed thereon contacting the base. The base and the lid are then heated in a heating device such as a reflow furnace to melt the solder layer on the lid and thereby solder the lid to the base.

Since the base is box-shaped having side walls, the side walls of the base can interfere with the installation of the electronic device on the bottom surface of the base. The side walls are also a bar to reduction in size. Furthermore, the dies required to form a ceramic into the shape of a box are expensive, and a great amount of time is required for shaping operations.

In light of these problems with respect to the ease of manufacture and economy of packages having a box-shaped base, recently, a simple flat plate-shaped base made of a ceramic has come to be used in place of a box-shaped base for packages of minute electronic parts such as SAW filters. A plate-shaped base is easier and less expensive to manufacture than a box-shaped base, and it is easier to mount an electronic device such as a surface acoustic wave device on a plate-shaped base than on a box-shaped base because of the absence of side walls.

A plate-shaped lid such as one used with a conventional box-shaped base cannot be used with a plate-shaped base, so it has been necessary to develop a cap-shaped lid having a recessed interior for use with a plate-shaped base.

A cap-shaped lid having a flange which has been proposed in the past for use with a plate-shaped base is shown in FIGS. 6 and 7. FIG. 6 is a perspective view of a cap-shaped lid with a flange, and FIG. 7 is a vertical cross-sectional view of the lid of FIG. 6 sealed to a plate-shaped base to form a package for an electronic device. A cap-shaped lid 11 has a rectangular top surface 12 and four side walls 13 which are bent downwards from the top surface 12. The lower ends of the side walls 13 are bent sideways to form a flange 14. Solder 15 is adhered to the entire is back surface of the flanged cap-shaped lid 11.

An electronic device S such as a surface acoustic wave device is mounted on a plate-shaped base K and is electrically connected to electrodes on the base K through bumps B. The cap-shaped lid 11 is disposed on the base K so as not to contact the electronic device S, and in this state, the base K and the lid 11 are heated in heating apparatus such as a reflow furnace. The solder 15 on the back surface of the lid 11 melts in the furnace. Thereafter, as the solder 15 cools and solidifies, it seals the lid 11 and the base K to each other.

As electronic equipment becomes increasingly smaller, there is a demand for reduction in size of each electronic part used in such electronic equipment. In an electronic part sealed in a package comprising a plate-shaped base and a flanged, cap-shaped lid as shown in FIGS. 6 and 7, the base must include a portion which is soldered to the flange of the lid. This portion of the base does not in any way contribute to the function of the electronic part, so it makes the electronic part unnecessarily large and it interferes with reduction in size of electronic equipment.

For this reason, it has been proposed to employ a cap-shaped lid without a flange in combination with a plate-shaped base. FIG. 8 is a perspective view of such a cap-shaped lid 16 without a flange, and FIG. 9 is a vertical cross-sectional view of the lid 16 of FIG. 8 soldered to a plate-shaped base K on which an electronic device S is mounted. In these figures, the same portions as in FIGS. 6 and 7 are affixed with the same reference numbers or letters, so an explanation of those portions will be omitted. Although the lid 16 of FIGS. 8 and 9 is smaller than the lid 11 of FIGS. 6 and 7 because it does not include a flange, it has the problem that it is difficult to form a complete seal between the lid 16 and the base K. Namely, when the lid 16 of FIGS. 8 and 9 is disposed on the base K and the two are heated in a reflow furnace, since solder is not present in the regions where the side walls 13 of the lid 16 contact the base K, solder does not penetrate between the side wall 13 and the base K, so they may not be completely sealed to each other.

SUMMARY OF THE INVENTION

The present invention provides a lid suitable for use with a plate-shaped base of a package for an electronic device. The size of the lid can be minimized while the lid can be reliably sealed to a plate-shaped base.

The present invention also provides a method for manufacturing such a lid.

The present invention further provides a packaged electronic device employing such a lid.

The present inventors found that a cap-shaped lid can be reliably soldered to a plate-shaped base by providing the lid with a tiny lip for contacting the base and previously applying solder to at least the portion of the lip which contacts the base. The lip projects outwards from a wall structure of the lid by only 10–500 μm, but it provides a sufficient region for enabling the lid to be soldered to the base to reliably form an airtight seal.

Thus, the present invention provides a cap-shaped lid for use with a generally flat base to seal an electronic device comprising a top portion, a wall structure extending around an entire periphery of the top portion and having an upper end connected to the top portion and a lower end, a lip connected to the lower end of the wall structure around an entire periphery of the wall structure and extending outwards from an outer surface of the wall structure by 10–500 μm, and solder applied to an inner surface of the lid on at least a portion of the lip.

The lid can be conveniently manufactured by subjecting a metal strip having solder applied to a surface thereof to drawing so as to form a recessed shape having a top portion, a wall structure extending from the top portion, and a flange extending from the lower end of the wall structure. Drawing is performed such that the surface having solder applied thereto is on the inside of the recessed shape. The flange is then severed, such as by punching, so as to form a lip having an outer end 10–500 μm from the outer surface of the wall structure.

The lid can be soldered to a generally flat or plate-shaped base to seal an electronic device mounted on the base by heating the lid and the base to melt the solder on the inner surface of the lid.

DESCRIPTION OF PREFERRED EMBODIMENTS

Figure 1:
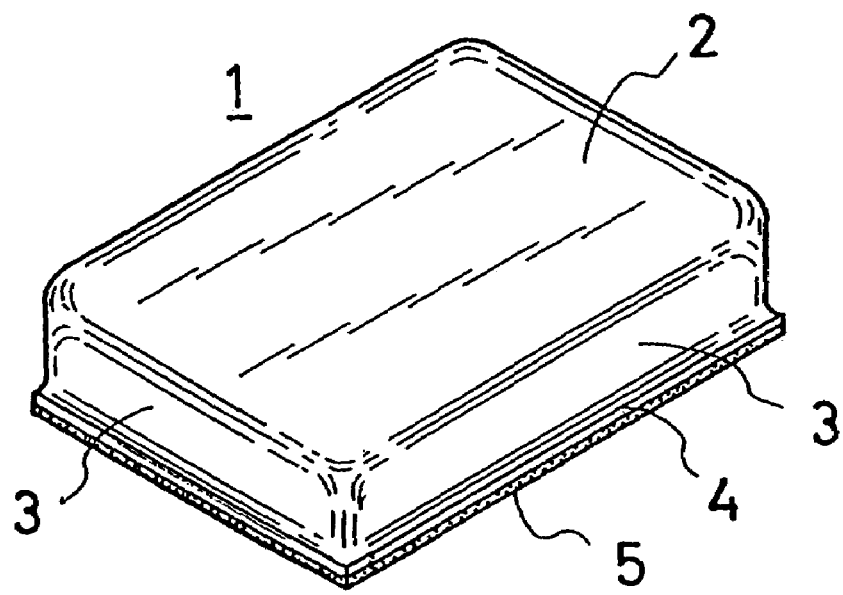
FIG. 1 is a perspective view of an embodiment of a lid according to the present invention.
Figure 2:
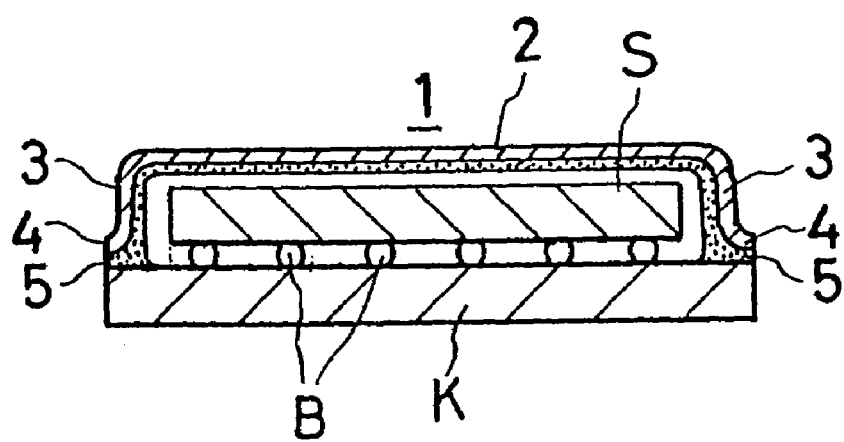
FIG. 2 is a vertical cross-sectional view of a package for an electronic device including the lid of FIG. 1 and a plate-shaped base soldered to the lid.

FIGS. 1 and 2 illustrate an embodiment of a lid 1 according to the present invention for use with a plate-shaped base K. As shown in these figures, the lid 1 is a cap-shaped member having a top portion 2, a wall structure extending downwards from the top portion 2 and including one or more side walls 3 extending around the entire periphery of the top portion 2, and a lip 4 formed at the lower end of the wall structure and extending around the entire periphery of the wall structure. Solder 5 is applied on the inner surface of the cap-shaped lid 1.

The shape of the top portion 2 of the lid 1 can be selected in accordance with the shape of the electronic device which the lid 1 is intended to cover. In many cases, the top portion 2 will have a polygonal shape such as a rectangle or a square. However, the top portion 2 may instead have a circular or other non-polygonal shape. The number of side walls in the wall structure depends upon the shape of the top portion 2 of the lid 1. For example, if the top portion 2 is rectangular, the wall structure will have four side walls 3. Preferably the side walls 3 extend substantially perpendicularly from the top surface as depicted, but they may be slightly slanted.

The size of the top portion 2 of the lid 1 is not limited, but preferably it is very small. Typically, the longest dimension of the top portion 2 is at most 1 cm and it may be as small as 5 mm or smaller.

The plate-shaped base K on which the lid 1 is to be mounted will usually have a shape as viewed in plan which is the same as that of the lid 1. The base K is usually a flat plate as depicted in the figures, but it may be deformed slightly in some cases.

The lid 1 can be made of materials conventionally used for the manufacture of cap-shaped lids for packages for electronic devices. Preferably it is made of a metallic material which can be shaped by drawing. Since the base K will frequently be made of a ceramic, the lid 1 is preferably made from a metallic material having a coefficient of thermal expansion similar to that of a ceramic. Some examples of suitable materials are Kovar and Alloy 42.

The lip 4 may be formed by any desired method, but it is particularly advantageous to form the lip 4 by performing drawing of a metal sheet or strip to define the top portion 2, the side walls 3, and a flange extending outwards from the side walls 3, and then cutting the flange at a distance of 10–500 μm from the outer surface of the side walls 3 to form the lip 4. Due to the nature of drawing, when the lip 4 is formed by cutting of a flange which has been shaped by drawing, the lip 4 will usually be curved with respect to the side walls 3 when viewed in cross section on a microscopic scale, regardless of whether drawing is performed so as to form a smooth transition between the side walls 3 and the flange (where the radius of curvature is relatively large) or so as to form a right angle (where the radius of curvature is small).

Figure 3:
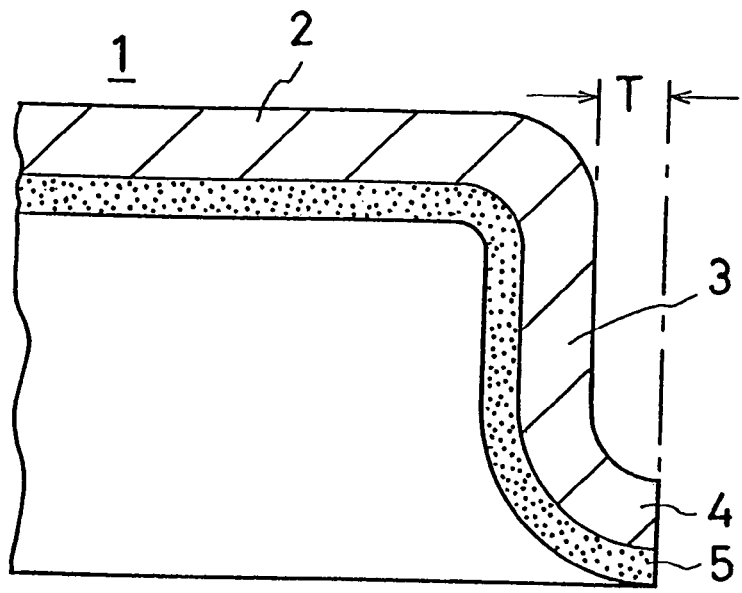
FIG. 3 is an enlarged vertical cross-sectional view of a portion of the lid of FIG. 1.

As shown in FIG. 3, which is an enlarged vertical cross-sectional view of a portion of the lid 1 of FIG. 1, the appropriate distance T by which the lip 4 projects outwards from the outer surface of the side walls 3 on which the lip 4 is formed is 10-500 μm.

Figure 10:
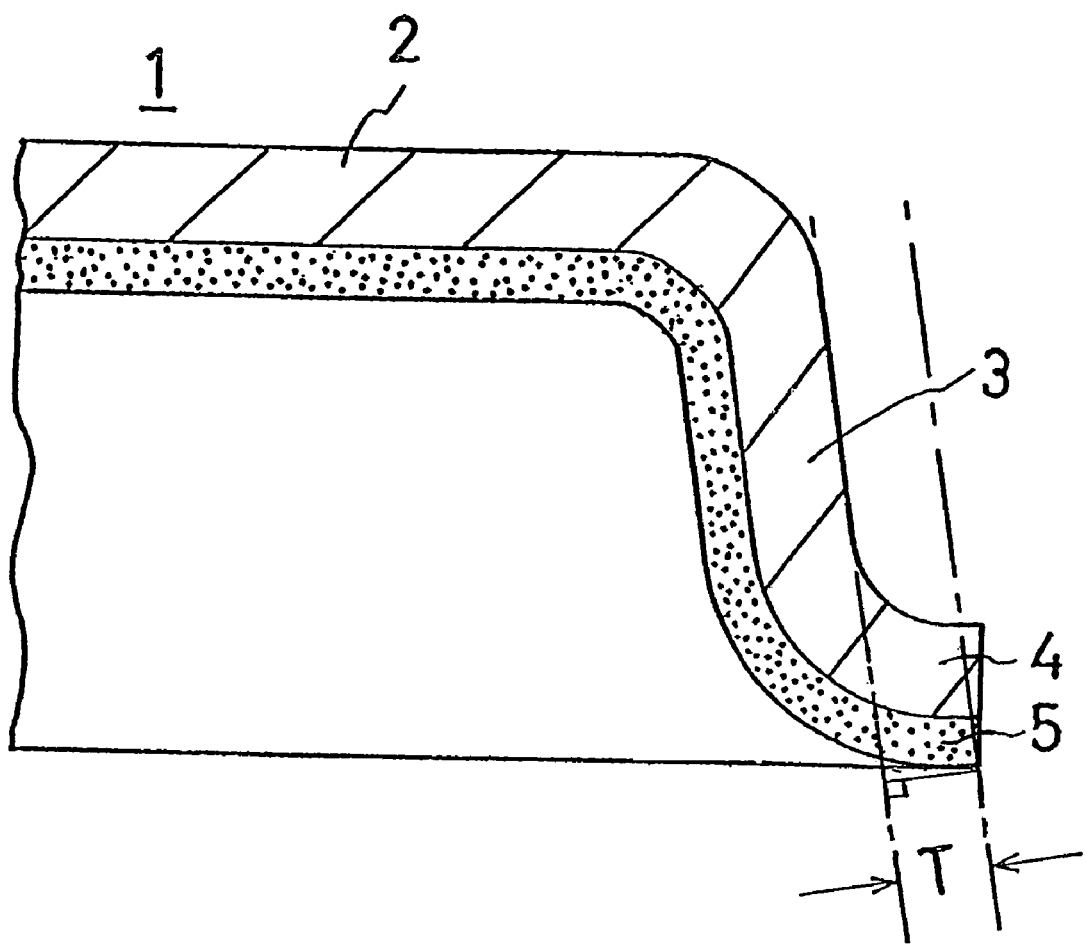
FIG. 10 is an enlarged vertical cross-sectional view of a portion of another form of a lid according to the present invention.

The distance T is defined as the shortest distance between the outer end (tip) of the inner (lower) surface of a lip 4 having solder 5 and an extension of the general outer surface of a side wall 3, which is the outer surface of the portion of the side wall which is straight in vertical cross section. The shortest distance is measured along a line normal to an extension of the general outer surface of the side wall 3, particularly when the wall structure is not vertical, as shown in FIG. 10.

If the lip 4 projects outwards by less than 10 μm, when the lid 1 is disposed on a plate-shaped base K and soldered to the base K, the area of contact between the lip 4 and the base K becomes too small, so the bonding strength between the lid 2 and the base K may be too weak. In addition, in the case in which small voids are present in the resulting soldered joint, gases can pass through the voids, and airtightness becomes poor. On the other hand, if the lip 4 projects outwards by more than 500 μm, the base K on which the lid 1 is disposed becomes unnecessarily large, which runs counter to the goal of minimizing the size of an electronic part.

Solder 5 is applied to the inner surface of the lid 1 on at least a portion of the lip 4 In order to further increase the strength and airtightness of a solder joint between the lid 1 and the base K, solder 5 is preferably applied to the entire inner surface of the lid 1. When the lid 1 is disposed on a plate-shaped base K and the two are heated, if solder 5 is applied to the entire inner surface of the lid 1, the solder 5 present between the lip 4 and the base K melts, and the solder 5 which was applied to the inner surface of the top portion 2 and the side walls 3 simultaneously melts. At this time, the molten solder between the lip 4 and the base K pulls the molten solder on the top portion 2 and the side walls 3 downwards, and a large amount of molten solder 5 accumulates in the vicinity of the lip 4 to create a joint between the lid 1 and the base K over a larger area. As a result, the strength and the airtightness of the solder joint are both increased.

When a lid 1 according to the present invention is disposed atop a base K, the solder 5 applied to the lip 4 preferably contacts the base K continuously around the entire periphery of the lid 1. If the solder 5 does not contact the base K at even one location around the periphery of the lid 1, the lid 1 cannot be reliably soldered to the base K in the location where contact does not take place, and leaks may occur in this location.

The solder 5 used on a lid according to the present invention is not restricted to any particular composition, but preferably it is a high temperature solder having a higher melting point than solder typically used to join a package to a printed circuit board so that the solder joining the lid 1 to the base K will not melt when soldering a package comprising the lid 1 and the base K to a printed circuit board. One example of a suitable high temperature solder is a Pb—Sn—Ag—Bi—In solder which is rich in Pb.

One example of a method of manufacturing a lid according to the present invention comprises performing drawing on a metal strip having solder 5 previously applied to the entire surface of one of its sides to define a top portion 2, a wall structure including one or more side walls 3, and a flange extending from the side walls 3, and then severing the flange at a prescribed location by punching to define the lip 4. In order to prevent the formation of cracks in the curved transition between the side walls 3 and the flange, drawing is preferably carried out in a series of steps with a series of dies of different depth rather than in a single drawing step.

It is conceivable to initially shape a lid from a metal strip having no solder in the same manner as described above and then apply solder to the inner surface of the lid on at least the portion of the lid using molten solder. However, when the lid is very small, e.g., on the order of millimeters in the largest dimension, this technique is not suitable.

The electronic device which is sealed in a package made up of a lid according to the present invention and a plate-shaped base is not restricted to any particular type, but it is normally a very small one such as a surface acoustic wave device serving as a SAW filter. The electronic device can be mounted on the plate-shaped base by any suitable technique, depending upon the structure of the electronic device.

Figure 4:
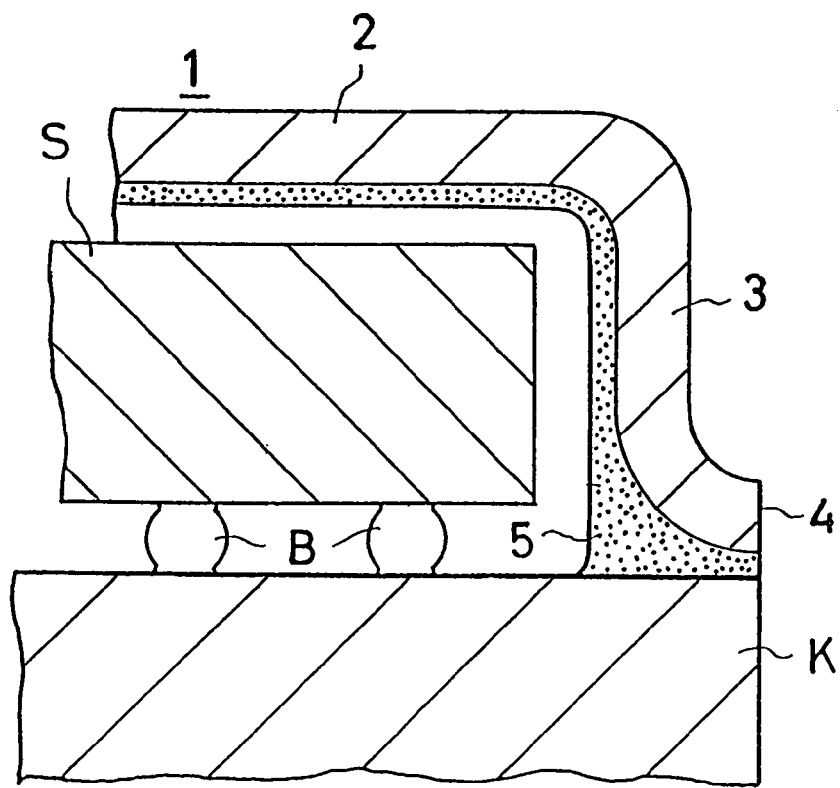
FIG. 4 is an enlarged vertical cross-sectional view of a portion of the package shown in FIG. 2.

For example, as shown in FIG. 2, an electronic device S can be electrically connected to electrodes on the top surface of the base K through bumps B. A metal which is easily wet by molten solder has preferably been applied to the portion of the top surface of the base K which is to be joined to the lid 1 by a method such as metallization. After the lid 1 is placed on the base K atop the electronic device S with the portion to be soldered of the lid 1 coinciding with the portion to be soldered of the base K, they are together heated in a reflow furnace to melt the solder 5 applied to the inner surface of the lid 1 and thereby solder the lid 1 to the base K. At this time, the molten solder 5 on the inner surface of the top portion 2 and the side walls 3 of the lid 1 is drawn downwards by the molten solder between the lip 4 and the base K, so as shown in FIG. 4, a large amount of solder 5 accumulates and forms a soldered joint in the vicinity of the lip 4.

Figure 5A:
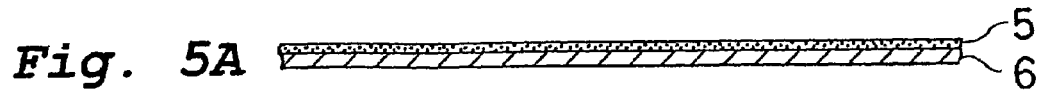
FIGS. 5A, 5B, and 5C are schematic vertical cross-sectional views of a metal strip being formed into a lid according to one form of the method of the present invention.
Figure 5B:
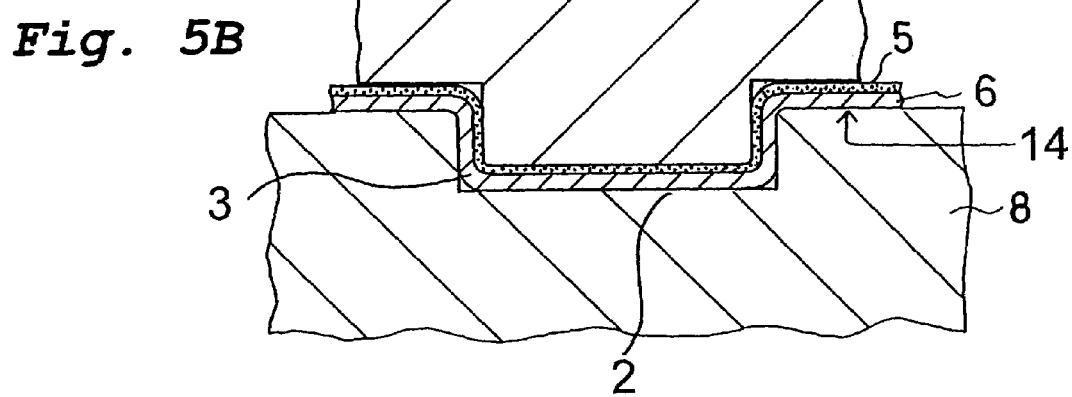
Figure 5C:
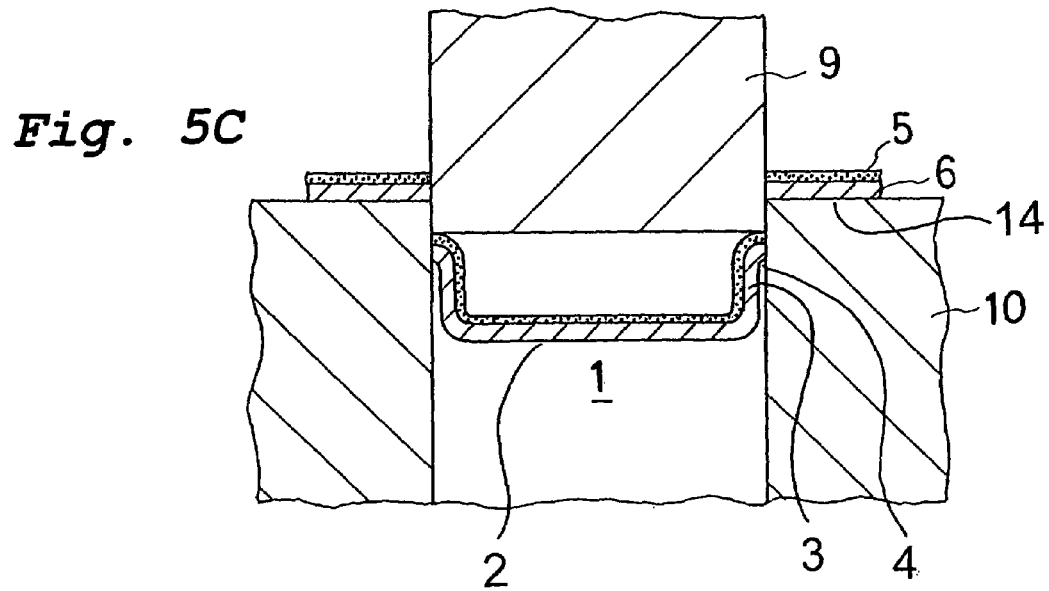
Figure 6:
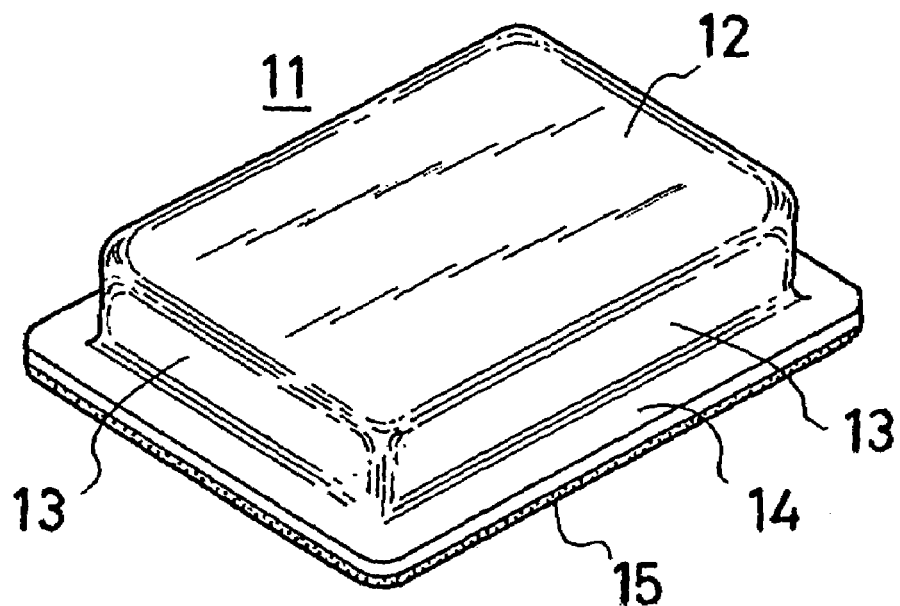
FIG. 6 is a perspective view of a lid having a flange which has been proposed in the past.
Figure 7:
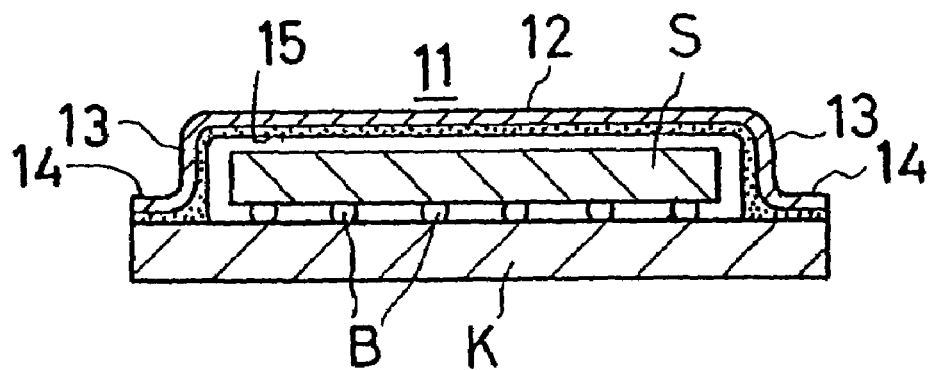
FIG. 7 is a vertical cross-sectional view of the lid of FIG. 6 soldered to a plate-shaped base to form a package for an electronic device.

FIGS. 5A–5C are vertical cross-sectional views schematically illustrating steps in an example of a method of forming a lid 1 according to the present invention.

First, as shown in FIG. 5A, a metal strip 6 made of a suitable material, such as Kovar, and having a layer of solder 5 applied to one side thereof is prepared. The solder 5 can be applied to the metal strip 6 by a variety of methods, including cladding, in which the metal strip 6 and a strip of solder 5 are together passed through rollers and mechanically bonded to each other, and a molten solder method, i.e., hot dipping, in which one side of the metal strip 6 is brought into contact with molten solder to plate the surface with solder. Of these two methods, the molten solder (hot dipping) method is preferred, since cladding causes work hardening of the strip 6, which makes subsequent drawing operations more difficult.

As shown in FIG. 5B, the metal strip 6 having a layer of solder 5 applied to one side thereof is then subjected to drawing in a press to form a recessed shape. The press includes a male die 7 with the same shape as the inner side of the lid 1 and a female die 8 with the same shape as the outer side of the lid 1. The surface of the metal strip 6 on which the solder 5 was applied is pressed by the male die 7. The drawing operation forms the strip 6 into a recessed shape having a top portion 2, side walls 3 extending vertically from the top portion 2, and a flange 14 extending sideways (horizontally) from the side walls 3 along the top surface of the female die 8. FIG. 5B shows a single set of male and female dies, but as mentioned earlier, drawing is preferably performed in a plurality of steps with a series of dies in which the female dies 8 become progressively deeper as drawing progresses so as to obtain more accurate dimensions and prevent cracking in the region where the strip 6 is bent to define the flange.

The recessed shape formed by the drawing operation of FIG. 5B is then punched out of the metal strip 6 by a punching press to form a lid 1. As shown in FIG. 5C, which illustrates the punching operation, the punching press has a punch 9 and a trimming die 10 of a size sufficient to sever the flange 14 in the curved transition portion between the side walls 3 and the flange 14 and define a lip 4 extending from the outer surface of the side walls 3 by 10–500 µm. A number of lids can be manufactured from the metal strip at the same time.

EXAMPLE

To demonstrate the effectiveness of a lid according to the present invention, a Pb—rich high temperature solder was applied by the molten solder (hot dipping) method on one side of a Kovar strip having a thickness of 100 µm to form a hot dipped solder layer with a thickness of 20 µm. The resulting strip was then subjected to drawing in the manner shown in FIG. 5B with a series of dies to form recessed shapes each having a rectangular top portion measuring 2.4×1.9 mm and having a depth of 0.4 mm. The solder layer was on the interior of the recessed shapes. The recessed shapes were then punched out of the strip with a punching press in the manner shown in FIG. 5C to obtain lids having a lip at the lower ends of the side walls of the lid and projecting from the outer surfaces of the side walls by 100 µm.

One of the resulting lids was disposed on a plate-shaped base having the same outer contour as the lid and an Au layer on the top surface along its periphery with a width of 100 µm, and the lid and the base were heated to perform soldering. The soldered lid and base were then subjected to a heat cycle test from −45° C. to +125° C. There were no leaks during 1000 heat cycles.

Figure 8:
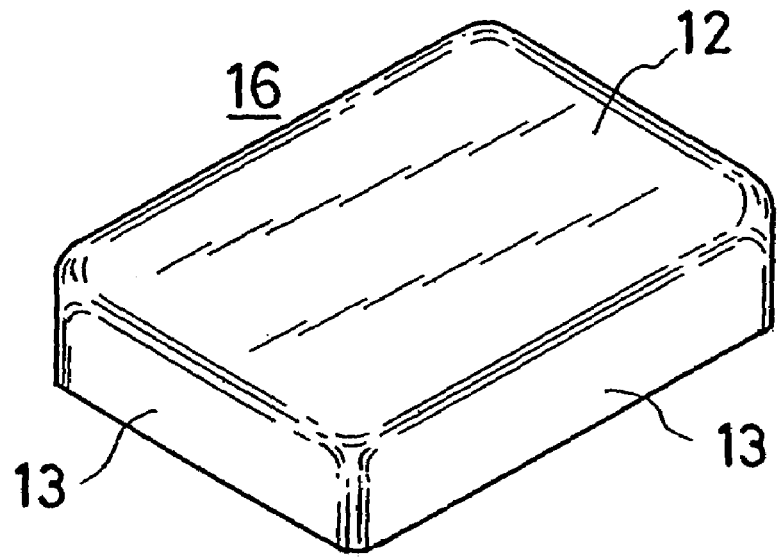
FIG. 8 is a perspective view of a lid without a flange which has been proposed in the past.
Figure 9:
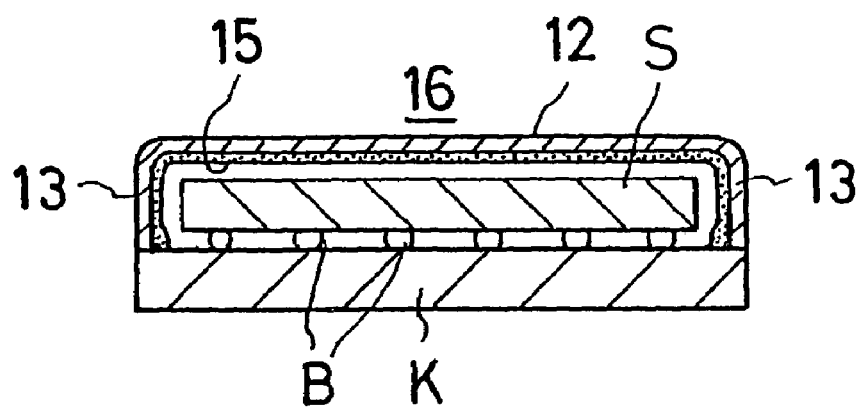
FIG. 9 is a vertical cross-sectional view of the lid of FIG. 8 soldered to a plate-shaped base to form a package for an electronic device.

For comparison, a cap-shaped lid having the shape shown in FIG. 8 which had no lip or flange was soldered to a plate-shaped base in the manner shown in FIG. 9, and the soldered lid and base were subjected to a heat cycle test under the same conditions as for the example of the present invention. In this case, a leak occurred after 40 cycles.

As described above, a lid according to the present invention has a tiny lip where the lid is to be soldered to a plate-shaped base, so the base can be close in size to the electronic device mounted thereon, which greatly contributes to reduction in size of electronic parts. In spite of the extremely small size of the lip, a joint having good strength and good airtightness and thus excellent reliability can be obtained.

What is claimed is:

1. A cap-shaped lid for use with a generally flat base to seal an electronic device comprising a top portion, a wall structure extending around an entire periphery of the top portion and having an upper end connected to the top portion and a lower end, a lip connected to the lower end of the wall structure around the entire periphery of the wall structure and extending outwards from an outer surface of the wall structure 10–500 μm, and a hot dipped solder layer formed on an entire inner surface of the lid.

2. A lid as claimed in claim 1 wherein the lip is curved with respect to the wall structure.

3. A lid as claimed in claim 1 wherein the top portion of the lid is polygonal.

4. A lid as claimed in claim 1 wherein the wall structure extends substantially perpendicularly with respect to the top portion.

5. A lid as claimed in claim 1 wherein the wall structure, the top portion, and the lip are formed from a single metal sheet.

6. A lid as claimed in claim 1 wherein the wall structure, the top portion, and the lip are without openings through which air can pass.

7. A lid as claimed in claim 1 wherein the lip extends outwards from the outer surface of the wall structure by 10–100 μm.

8. A packaged electronic part comprising a generally flat base, an electronic device mounted on a top surface of the base, and a cap-shaped lid according to claim 1 covering the electronic device and soldered to the top surface of the base and hermetically sealing the electronic device inside a package defined by the base and the lid.

9. A packaged electronic part as claimed in claim 8 wherein the lid is connected to the base by a solder joint including solder which has flowed downwards from an inner surface of the wall structure towards the base.

10. A method of manufacturing a cap-shaped lid as claimed in claim 1 comprising performing drawing of a metal sheet having a hot dipped solder layer formed on an entire first side of the metal sheet to form a recessed shape including the top portion, the wall structure, and a flange extending outward from the wall structure with the first side of the metal strip on the interior of the recessed shape, and then severing the flange around and entire periphery of the recessed shape at a distance of 10–50 μm from the outer side of the wall structure to define the lip.

11. A method as claimed in claim 10 including severing the flange with a punch.

12. A method as claimed in claim 10 including severing the flange in apportion of the flange which is curved with respect to the wall structure.

* * * * *